(12) United States Patent
Li et al.

(10) Patent No.: US 11,996,507 B2
(45) Date of Patent: May 28, 2024

(54) DISPLAY PANEL AND METHOD OF MANUFACTURING THE SAME

(71) Applicants: CHONGQING HKC OPTOELECTRONICS TECHNOLOGY CO., LTD., Chongqing (CN); HKC CORPORATION LIMITED, Shenzhen (CN)

(72) Inventors: Zeyao Li, Chongqing (CN); Haijiang Yuan, Chongqing (CN)

(73) Assignees: CHONGQING HKC OPTOELECTRONICS TECHNOLOGY CO., LTD., Chongqing (CN); HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/077,204

(22) Filed: Dec. 7, 2022

(65) Prior Publication Data
US 2023/0387367 A1    Nov. 30, 2023

(30) Foreign Application Priority Data
May 24, 2022   (CN) .......................... 202210572502.6

(51) Int. Cl.
*H01L 27/15*   (2006.01)
*H01L 29/26*   (2006.01)
(Continued)

(52) U.S. Cl.
CPC ............ *H01L 33/62* (2013.01); *H01L 33/005* (2013.01); *H01L 2933/0066* (2013.01)

(58) Field of Classification Search
CPC .................. H01L 33/62; H01L 33/005; H01L 2933/0066
See application file for complete search history.

(56) References Cited

U.S. PATENT DOCUMENTS 11,102,888 B2 *  8/2021  Zhang .................... H05K 1/189
11,164,934 B2 * 11/2021  Bower ................... H10K 59/18
(Continued)

FOREIGN PATENT DOCUMENTS

CN     113053254 A     6/2021
CN     113674614 A    11/2021
(Continued)

OTHER PUBLICATIONS

Chinese First office action, Application No. 202210572502.6, dated Feb. 14, 2023( 14 pages).

*Primary Examiner* — Ismail A Muse

(57) ABSTRACT

A method of manufacturing a display panel includes following operations. A display substrate is provided. The display substrate includes a first surface, a second surface opposite to the first surface, and a side surface connected to the first surface and the second surface. An array circuit layer is arranged on the first surface of the display substrate. A connecting substrate is provided. A binding circuit layer and a connecting circuit layer connected to the binding circuit layer are formed on a surface of the connecting substrate. The connecting substrate having the binding circuit layer and the connecting circuit layer is fixed to a side of the display substrate. The connecting circuit layer may be electrically connected to the array circuit layer, and the array circuit layer is electrically connected to the binding circuit layer through the connecting circuit layer. A control unit is bound on the binding circuit layer.

7 Claims, 8 Drawing Sheets

(51) Int. Cl.
*H01L 31/12* (2006.01)
*H01L 33/00* (2010.01)
*H01L 33/62* (2010.01)

(56) References Cited

U.S. PATENT DOCUMENTS

| | | | |
|---|---|---|---|
| 2020/0020272 A1* | 1/2020 | Huang | G02F 1/13452 |
| 2020/0051966 A1 | 2/2020 | Lee et al. | |
| 2020/0142540 A1* | 5/2020 | Rahmani | H05K 1/111 |
| 2020/0295120 A1* | 9/2020 | Bower | H10K 50/865 |
| 2020/0303608 A1 | 9/2020 | Song | |
| 2022/0230944 A1* | 7/2022 | Koduri | H01L 21/4853 |

FOREIGN PATENT DOCUMENTS

| | | |
|---|---|---|
| CN | 113745393 A | 12/2021 |
| JP | 2014215424 A | 11/2014 |

* cited by examiner

DISPLAY PANEL AND METHOD OF MANUFACTURING THE SAME

CROSS REFERENCE TO RELATED APPLICATIONS

The present disclosure claims priority of Chinese Patent Application No. 202210572502.6, filed on May 24, 2022 in China National Intellectual Property Administration, the entire contents of which are hereby incorporated by reference in their entireties.

TECHNICAL FIELD

The present disclosure relates to the field of displaying, and in particular to a display panel and a method of manufacturing a display panel.

BACKGROUND

Displays having no bezel are more and more popular for customers.

In the art, wires may be arranged on a side of a glass substrate, such that display circuits on a front of the glass substrate may be connected to the side or a rear of the glass substrate to form a binding circuit layer. External circuits may be bound to the binding circuit layer on the side or the rear of the glass substrate.

However, as a size of a display substrate becomes increases, arranging wires on the side of the glass substrate to prepare circuits may not be performed easily.

SUMMARY OF THE DISCLOSURE

According to a first aspect, a method of manufacturing a display panel is provided and includes: providing a display substrate, wherein the display substrate includes a first surface, a second surface opposite to the first surface, and a side connected to the first surface and the second surface; arranging an array circuit layer on the first surface of the display substrate; providing a connecting substrate; forming a binding circuit layer and a connecting circuit layer connected to the binding circuit layer on a surface of the connecting substrate; fixing the connecting substrate arranged with the binding circuit layer and the connecting circuit layer to the side of the display substrate; electrically connecting the connecting circuit layer to the array circuit layer, and electrically connecting the array circuit layer to the binding circuit layer through the connecting circuit layer; and binding a control unit on the binding circuit layer.

According to a second aspect of the present disclosure, a display panel is provided and includes: a display substrate, including a first surface, a second surface opposite to the first surface, and a side connected to the first surface and the second surface; an array circuit layer, arranged on the first surface of the display substrate; a connecting substrate, fixed to the side of the display substrate; a binding circuit layer and a connecting circuit layer connected to the binding circuit layer, arranged on a surface of the connecting substrate, wherein the connecting circuit layer is electrically connected to the array circuit layer; and a control unit, bound on the binding circuit layer.

BRIEF DESCRIPTION OF THE DRAWINGS

In order to more clearly illustrate the technical solutions in the embodiments of the present disclosure, drawings for describing the embodiments will be described in brief in the following. Apparently, the drawings in the following show only some of the embodiments of the present disclosure, and other drawings may be obtained by any ordinary skilled person in the art based on these drawings without any creative work.

REFERENCE NUMERALS

1—diplay panel, 10—array circuit layer, 101—first surface, 102—second surface, 103—first side, 11—slot, 13—connecting portion, 15—semiconductor layer, 151—source electrode, 152—drain electrode, 153—channel, 16—insulation layer, 17—gate electrode, 18—planarization layer, 181—first through hole, 182—conductive material, 19—third metal layer, 191—second electrode, 192—first electrode, 193—signal line, 2—connecting substrate, 201—third surface, 202—fourth surface, 203—second side, 21—binding circuit layer, 22—connecting circuit layer, 24—anisotropic conductive adhesive, 3—control unit, 4—light-emitting unit, 41—insulation filling layer, 5—capsulation substrate, 100—display panel.

DETAILED DESCRIPTION

Technical solutions of the embodiments of the present disclosure will be clearly and completely described below by referring to the accompanying drawings in the embodiments of the present disclosure. Obviously, the described embodiments show only some of, but not all of, the embodiments of the present disclosure. All other embodiments obtained by any ordinary skilled person in the art based on the embodiments in the present disclosure without making creative work shall fall within the scope of the present disclosure.

Terms "first" and "second" in the present disclosure are used for descriptive purposes only, and shall not be interpreted as indicating or implying relative importance or implicitly specifying the number of the described technical features. Therefore, features defined by the "first" and the "second" may explicitly or implicitly include at least one such feature. All directional indications (such as up, down, left, right, forward, backward) in the present disclosure are used to explain relative positions between components at a particular pose (the pose shown in the accompanying drawings), movements, and so on. When the particular pose changes, the directional indications may change accordingly. In addition, terms "includes", "has", and any variations thereof, are intended to cover non-exclusive inclusion. For example, a process, a method, a system, a product or an apparatus including a series of operations or units is not limited to the listed operations or units, but may further include operations or units that are not listed, or other operations or units that are inherent to the process, the method, the product, or the apparatus.

An "embodiment" of the present disclosure means that a particular feature, a structure, or a property described one embodiment may be included in at least one other embodiments of the present disclosure. The presence of the term at various sections in the specification does not necessarily mean a same embodiment or a separate or an alternative embodiment that is mutually exclusive with other embodiments. It shall be understood explicitly and implicitly by the ordinary skilled person in the art that the embodiments described herein may be combined with other embodiments.

Figure 1:
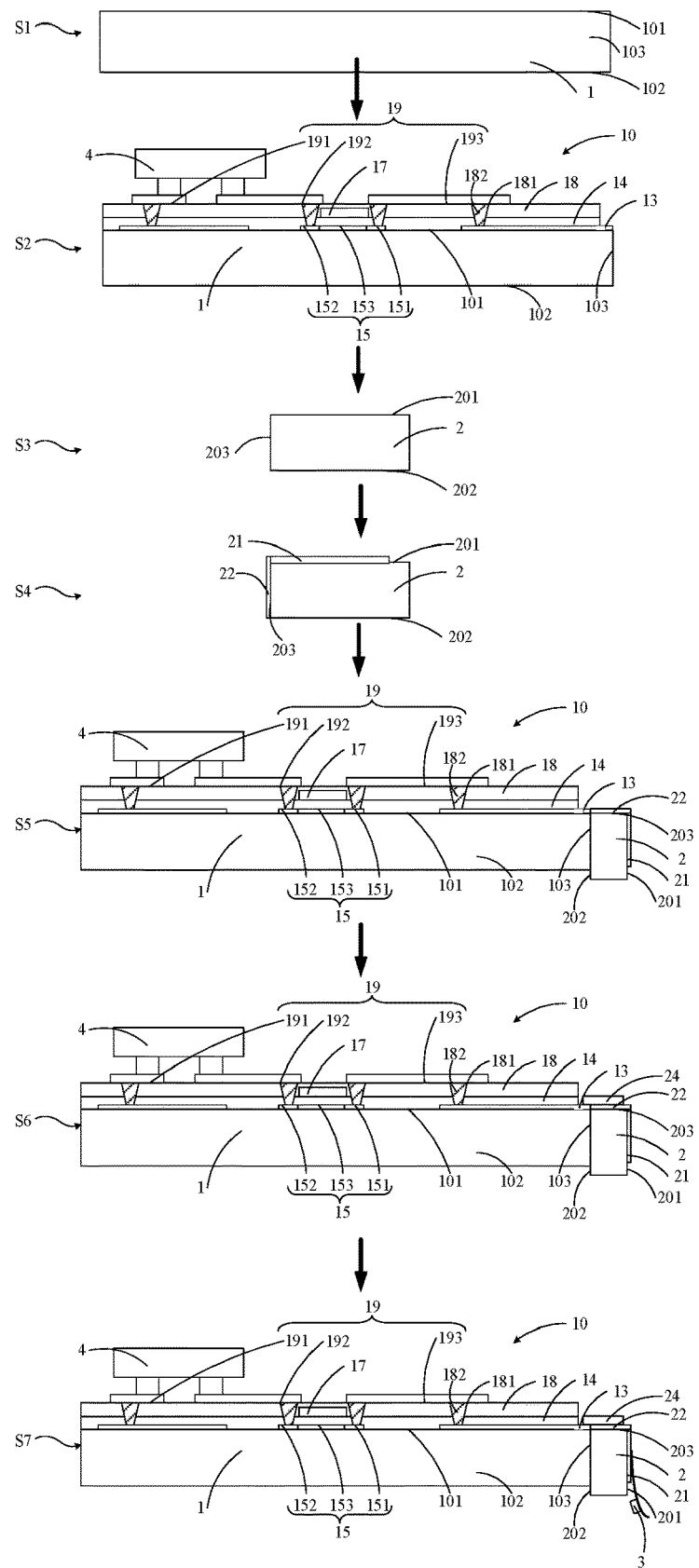
FIG. 1 is a flow chart of a method of manufacturing a display panel according to a first embodiment of the present disclosure.
Figure 2:
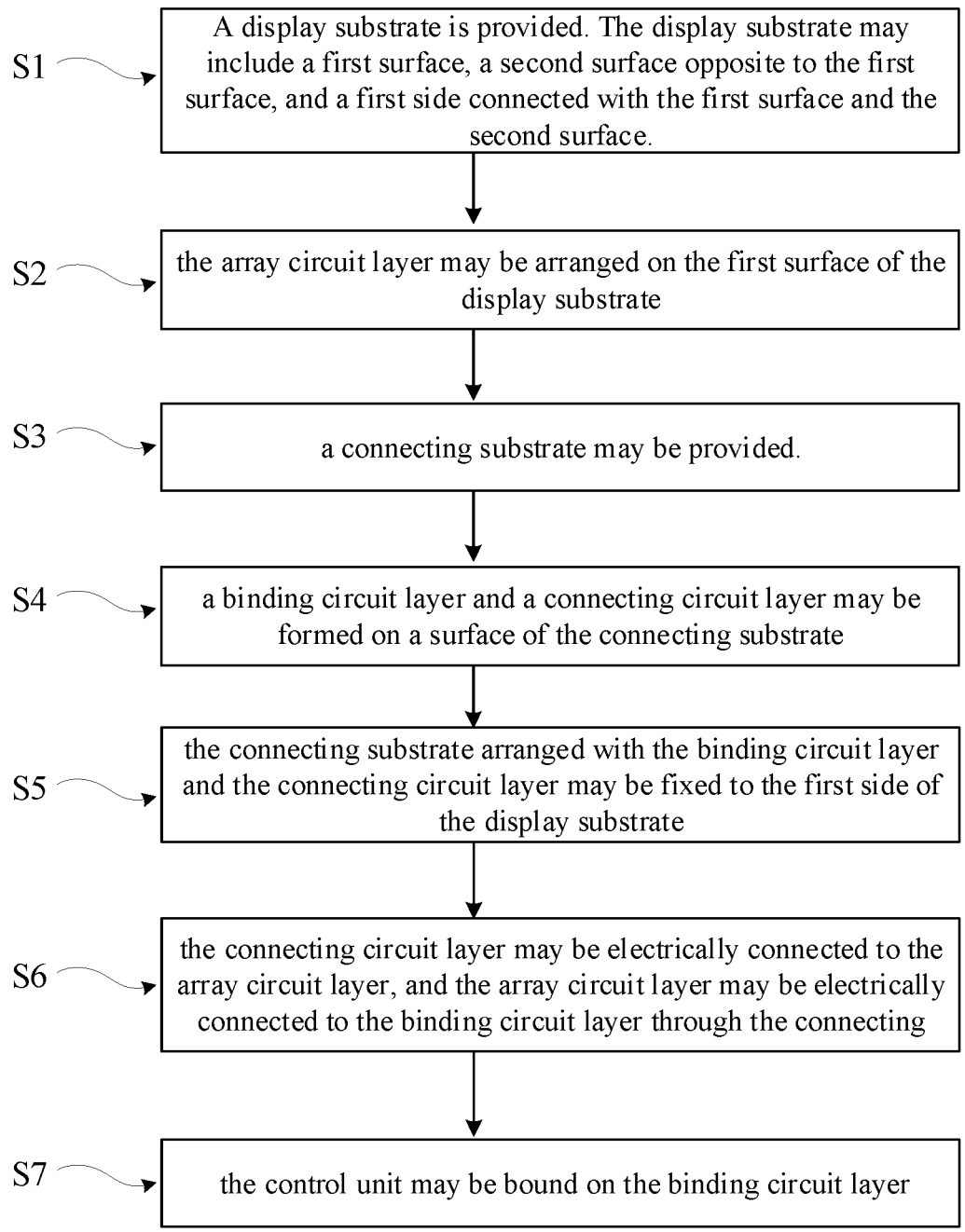
FIG. 2 is a flow chart of blocks showing the method of manufacturing the display panel according to the first embodiment of the present disclosure.

As shown in FIG. 1 and FIG. 2, FIG. 1 is a flow chart of a method of manufacturing a display panel according to a first embodiment of the present disclosure, and FIG. 2 is a flow chart of blocks showing the method of manufacturing the display panel according to the first embodiment of the present disclosure.

A method for manufacturing a display panel 100 may include following operations.

In an operation S1, a display substrate 1 is provided. The display substrate 1 may include a first surface 101, a second surface 102 opposite to the first surface 101, and a first side 103 connected with the first surface 101 and the second surface 102.

In detail, the display substrate 1 may serve as a substrate of the display panel 100, and an array circuit layer 10 or other functional layers may be arranged on the substrate. The oppositely-arranged first surface 101 and second surface 102 of the display substrate 1 may be an upper surface and a lower surface of the display substrate, or may be a front surface and a rear surface of the display substrate 1. The first side 103 may a surface connected with the first surface 101 and the second surface 102. The display substrate 1 may be a rigid substrate, such as silicon wafer, glass or ceramic, or may be a flexible substrate made of polymeric flexible material, such as polyimide (PI). Since the array circuit layer 10 needs to be arranged on the display substrate 1 of the present disclosure, the rigid substrate may be preferred, serving as the display substrate 1, such that the display substrate 1 may provide support for the array circuit layer 10.

In an operation S2, the array circuit layer 10 may be arranged on the first surface 101 of the display substrate 1.

In detail, the array circuit layer 10 may be formed by performing thin-film techniques, photolithographic processes, and so on. Further, a light-emitting unit 4 may further be arranged on the array circuit layer 10 after the operation S2. The light-emitting unit 4 may be an LED, such as a micro-LED or a mini-LED. A plurality of light-emitting units 4 may be transferred to the array circuit layer 10 by performing a huge-amount-transferring method.

In an embodiment, the array circuit layer 10 may include a first metal layer (not shown), an insulating layer 16, a second metal layer (not shown), a planarization layer 18 and a third metal layer 19, all of which are arranged successively. The first metal layer may be patterned, and a plurality of connecting portions 13 are formed. The plurality of connecting portions 13 may be spaced apart from each other, and a semiconductor layer 15 may be disposed between adjacent two connecting portions of the plurality of connecting portions 13. Two ends of the semiconductor layer 15 may be doped to form a source electrode 151, a drain electrode 152, and a channel 153 insulating the source electrode 151 from the drain electrode 152. The semiconductor layer 15 may be a semiconductor layer made of low temperature polycrystalline silicon or indium oxide, which will not be limited herein.

An insulation layer 16 may be arranged to completely cover the semiconductor layer 15 and the connecting portion 13 to insulate the semiconductor layer 15, the connecting portion 13 and other metal layers to prevent short circuits. The insulation layer 16 may be oxide or nitride, such as silicon oxide or aluminum oxide, or may be a polymer, such as PI.

The second metal layer may be patterned to form the gate electrode 17, and the insulation layer 16 may insulate and isolate the connecting portion 13 and the semiconductor layer 15 from the gate electrode 17 to prevent short circuits. When a voltage is applied to the gate electrode 17, the source electrode 151 and the drain electrode 152 may be be conducted to supply power to the light-emitting unit 4 of the display panel 100.

A planarization layer 18 may be deposited on a side of the second metal layer away from the insulation layer 16 to planarize wires of the second metal layer, such that other functional layers may be arranged on the second metal layer. In addition, the planarization layer 18 may insulate the second metal layer and the third metal layer 19.

A first through hole 181 may be defined in the planarization layer 18 and the insulation layer 16, such that the connecting portion 13 may be partially exposed. Conductive material 182 may be received in and fill the first through hole 181. Further, the third metal layer 19 may be deposited, and the third metal layer 19 may contact the conductive material 182 in the first through hole 181, such that the third metal layer 19 may be electrically connected with the connecting portion 13. The third metal layer 19 may be patterned to form a signal line 193, a first electrode 192, and a second electrode 191. The signal line 193 may be electrically connected to the source electrode 151. An end of the first electrode 192 may be electrically connected to the drain electrode 152, and the other end of the first electrode 192 may be electrically connected to an anode of the light-emitting unit 4. An end of the second electrode 191 may be electrically connected to the connecting portion 13, and the other end of the second electrode 191 may be electrically connected to a cathode of the light-emitting unit 4. In this way, the light-emitting unit 4 may be powered by the first electrode 192 and the second electrode 191, such that the light-emitting unit 4 may provide light for the display panel 100.

It shall be understood that, the signal line 193 may be a Vdd line. The second electrode 191 may be connected to a Vss line through the connecting portion 13. The third metal layer 19 may be patterned to further form other signal lines, such as V data lines, and so on. Circuits may be determined based on actual demands.

In an operation S3, a connecting substrate 2 may be provided.

In detail, the connecting substrate 2 may be a substrate different from the display substrate 1. The connecting substrate 2 and the display substrate 1 may be made of a same material or different materials. A shape and a size of the connecting substrate 2 may be determined based on actual demands, and will not be limited by the present disclosure. The connecting substrate 2 may include a third surface 201, a fourth surface 202, and a second side 203 connected to the third surface 201 and the fourth surface 202.

In an operation S4, a binding circuit layer 21 and a connecting circuit layer 22 may be formed on a surface of the connecting substrate 2.

In detail, a side of the binding circuit layer 21 away from the connecting substrate 2 may be bound to an external control unit 3. The connecting circuit layer 22 may be connected to the array circuit layer 10 of the display substrate 1. The binding circuit layer 21 and the connecting circuit layer 22 may be arranged on a same surface or different surfaces of the connecting substrate 2. However, the binding circuit layer 21 and the connecting circuit layer 22 need to be electrically connected. The binding circuit layer 21 and the connecting circuit layer 22 may be in direct contact with each other to achieve electrical connection. Alternatively, the binding circuit layer 21 may be electrically connected to the connecting circuit layer 22 through some conductive media. For example, the binding circuit layer 21 may be arranged on the third surface 201 of the connecting substrate 2 or the fourth surface 202 of the connecting substrate 2 opposite to the third surface 201. The connecting circuit layer 22 may be arranged on the second side 203 connected to the third surface 201 or the fourth surface 202 where the binding circuit layer 21 is arranged. The binding circuit layer 21 and the connecting circuit layer 22 may be made of a same material or different materials. An order of arranging the binding circuit layer 21 and the connecting circuit layer 22 may not be limited by the present disclosure. Each of the binding circuit layer 21 and the connecting circuit layer 22 may be obtained by arranging a metal layer on the surface of the connecting substrate 2 and patterning the metal layer. The present disclosure does not limit how to obtain the binding circuit layer 21 and the connecting circuit layer 22.

In an operation S5, the connecting substrate 2 arranged with the binding circuit layer 21 and the connecting circuit layer 22 may be fixed to the first side 103 of the display substrate 1.

In detail, a surface of the connecting substrate 2 that contacts the display substrate 1 may be a surface that is not arranged with the binding circuit layer 21 and connecting circuit layer 22. A manner of how connecting substrate 2 is fixed to the display substrate 1 may not be limited by the present disclosure. For example, the surface of the connecting substrate 2 that contacts the display substrate 1 may be fixed by glue or by other means, which will not be limited herein.

In an operation S6, the connecting circuit layer 22 may be electrically connected to the array circuit layer 10, and the array circuit layer 10 may be electrically connected to the binding circuit layer 21 through the connecting.

In detail, the connecting circuit layer 22 arranged on the second side 203 of the connecting substrate 2 may be electrically connected to the array circuit layer 10. Specifically, the connecting circuit layer 22 may be connected to the connecting portion 13 of the array circuit layer 10. In addition, since the connecting circuit layer 22 is electrically connected to the binding circuit layer 21, the connecting portion 13 may be electrically connected to the binding circuit layer 21 through the connecting circuit layer 22. The connecting circuit layer 22 and the array circuit layer 10 can be electrically connected by an anisotropic conductive adhesive 24 or a conductive paste, such that electrical connection may be improved.

In an operation S7, the control unit 3 may be bound on the binding circuit layer 21.

In detail, the control unit 3 may be bound directly on a surface of the binding circuit layer 21 away from the connecting substrate 2. The control unit 3 may be an IC chip or any other control unit, which will not be limited by the present disclosure.

Figure 3:
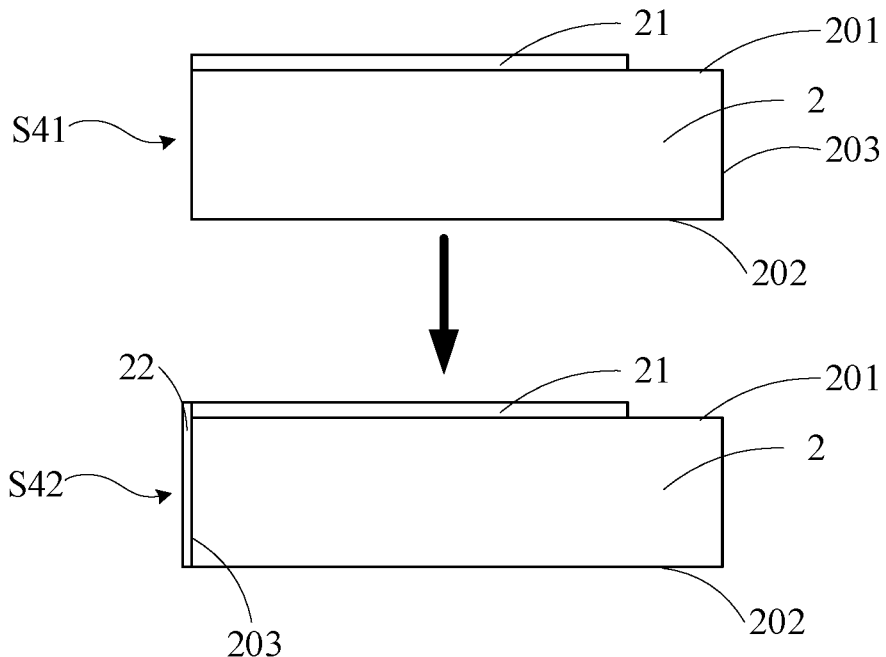
FIG. 3 is a flow chart of forming a binding circuit layer and a connecting circuit layer connected to the binding circuit layer on a surface of a connecting substrate according to a first embodiment of the present disclosure.
Figure 4:
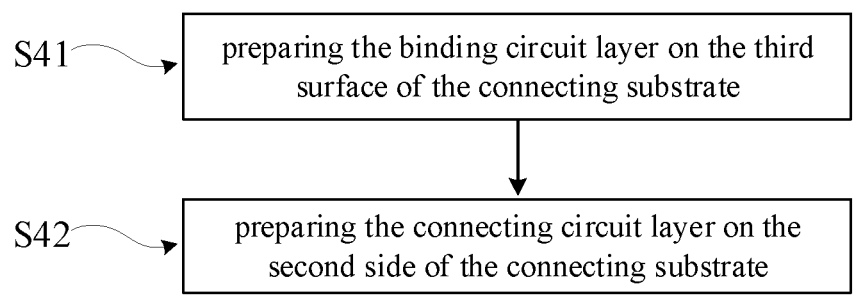
FIG. 4 is a flow chart of blocks showing forming the binding circuit layer and the connecting circuit layer connected to the binding circuit layer on the surface of the connecting substrate according to the first embodiment of the present disclosure.

As shown in FIG. 3 and FIG. 4, FIG. 3 is a flow chart of forming the binding circuit layer and the connecting circuit layer connected to the binding circuit layer on the surface of the connecting substrate according to the first embodiment of the present disclosure, and FIG. 4 is a flow chart of blocks showing forming the binding circuit layer and the connecting circuit layer connected to the binding circuit layer on the surface of the connecting substrate according to the first embodiment of the present disclosure.

In an embodiment, the operation S4 of forming the binding circuit layer 21 and the connecting circuit layer 22 connected to the binding circuit layer 21 on the surface of the connecting substrate 2 may include following operations.

In an operation S41, preparing the binding circuit layer 21 on the third surface 201 of the connecting substrate 2.

In an operation S42, preparing the connecting circuit layer 22 on the second side 203 of the connecting substrate 2.

In detail, the order of arranging the binding circuit layer 21 and the connecting circuit layer 22 may not be limited herein. In some embodiments, the binding circuit layer 21 may be prepared on the third surface 201 first, and subsequently, the connecting circuit layer 22 may be prepared on the second side 203. In some embodiment, the order of preparing the binding circuit layer 21 and the connecting circuit layer 22 may be reversed. The present disclosure does not limit the order of the arrangement. In some embodiments, the binding circuit layer 21 and the connecting circuit layer 22 may be prepared on the second side 203 at the same time by arranging wires on sides. It shall be understood that, the binding circuit layer 21 and the connecting circuit layer 22 need to be electrically connected. The binding circuit layer 21 and the connecting circuit layer 22 may be in direct contact to achieve the electrical connection. In some embodiments, the binding circuit layer 21 and the connecting circuit layer 22 may be electrically connected through some conductive media. A portion of the connecting circuit layer 22 may be arranged on the third surface 201 in direct contact with the binding circuit layer 21. In some embodiments, the binding circuit layer 21 may be prepared on the fourth surface 202.

Figure 5:
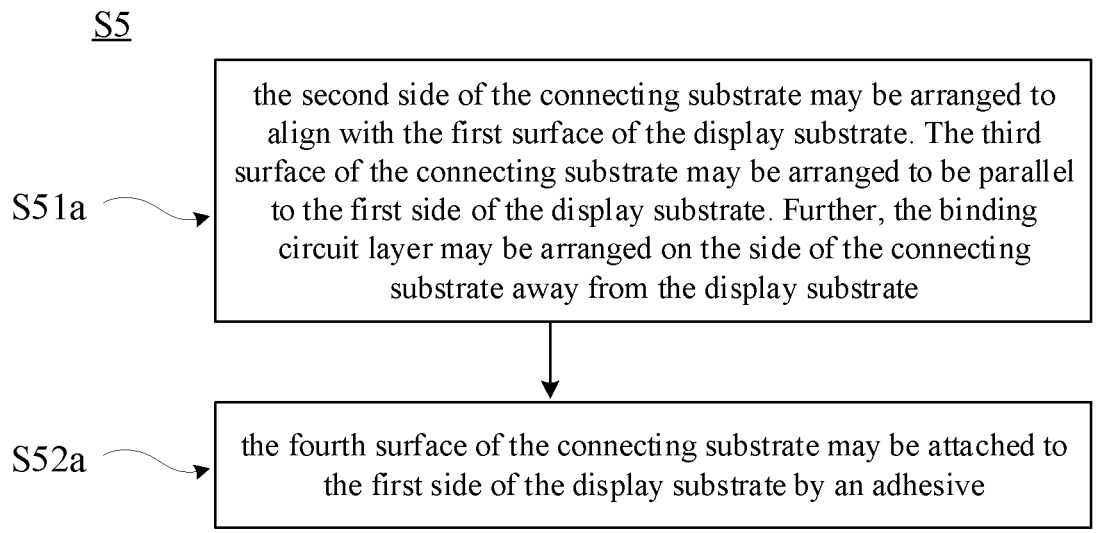
FIG. 5 is a flow chart of fixing the connecting substrate arranged with the binding circuit layer and the connecting circuit layer to a first side of the display substrate according to the first embodiment of the present disclosure.

As shown in FIG. 5, FIG. 5 is a flow chart of fixing the connecting substrate arranged with the binding circuit layer and the connecting circuit layer to the first side of the display substrate according to the first embodiment of the present disclosure.

In an embodiment, the operation S5 of fixing the connecting substrate 2 arranged with the binding circuit layer 21 and the connecting circuit layer 22 to the first side 103 of the display substrate 1 may include following operations.

In an operation S51a, the second side 203 of the connecting substrate 2 may be arranged to align with the first surface 101 of the display substrate 1. The third surface 201 of the connecting substrate 2 may be arranged to be parallel to the first side 103 of the display substrate 1. Further, the binding circuit layer 21 may be arranged on the side of the connecting substrate 2 away from the display substrate 1.

In an operation S52a, the fourth surface 202 of the connecting substrate 2 may be attached to the first side 103 of the display substrate 1 by an adhesive.

In detail, the second side 203 of the connecting substrate 2 may be arranged to align with the first surface 101 of the display substrate 1, and the third surface 201 of the connecting substrate 2 may be arranged to be parallel to the first side 103 of the display substrate 1. In addition, the binding circuit layer 21 may be arranged on the side of the connecting substrate 2 away from the display substrate 1, and the connecting circuit layer 22 may be arranged on a side near the array circuit layer 10. The surface that is arranged with the binding circuit layer 21 may be the third surface 201 of the connecting substrate 2, and a surface of the connecting substrate 2 that contacts the display substrate 1 may be the fourth surface 202 of the connecting substrate 2. The third surface 201 and the fourth surface 202 may be opposite to each other. The connecting circuit layer 22 may be arranged on the second side 203 that is connected to the third surface 201 and the fourth surface 202. The first side 103 of the display substrate 1 may contact and connect to the fourth surface 202 of the connecting substrate 2 by the adhesive.

In an embodiment, the operation S6 of electrically connecting the connecting circuit layer 22 to array circuit layer 10 may include following operations.

In an operation S61, the anisotropic conductive adhesive 24 or the printed conductive paste may be arranged at a position where the connecting circuit layer 22 and array circuit layer 10 are connected with each other.

Figure 6:
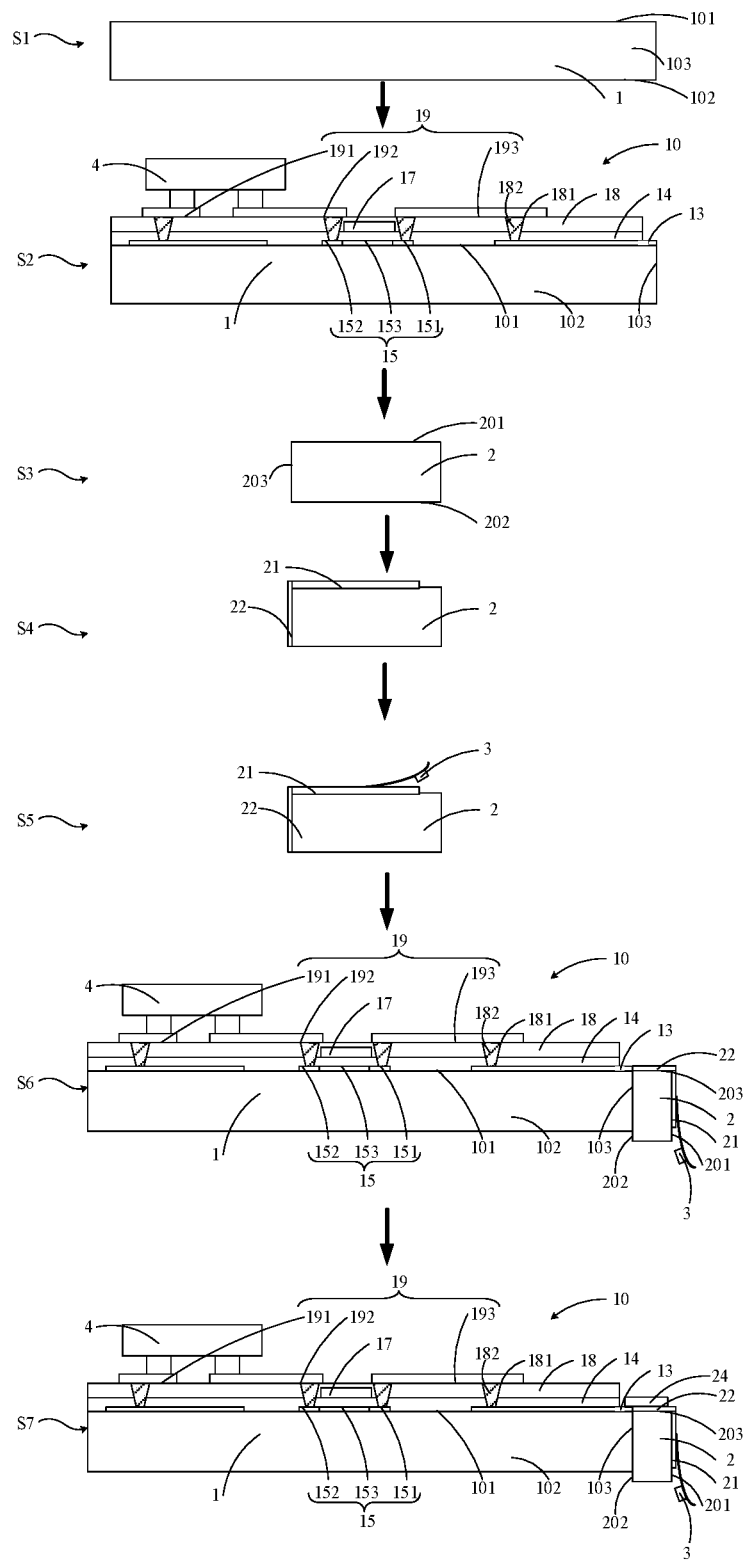
FIG. 6 is a flow chart of a method of manufacturing a display panel according to a second embodiment of the present disclosure.

As shown in FIG. 6, FIG. 6 is a flow chart of a method of manufacturing a display panel according to a second embodiment of the present disclosure.

The method of manufacturing the display panel 100 in the present embodiment may be essentially the same as the method of manufacturing the display panel 100 in the first embodiment. Specifically, in the present embodiment, the operation of binding the control unit 3 on the binding circuit layer 21 needs to be performed before the fixing the connecting substrate 2 to the first side 103 of the display substrate 1. That is, the binding circuit layer 21 and the connecting circuit layer 22 connected to the binding circuit layer 21 may be formed on the connecting substrate 2, subsequently, the operation of binding the control unit 3 may be performed, and further subsequently, the connecting substrate 2 may be connected to the display substrate 1. In this way, binding the control unit 3 is not performed after the connecting substrate 2 being fixed to the display substrate 1, and the control unit 3 may be bound easily. Further, an impact on the array circuit layer 10, which is caused by a high temperature and a pressure while performing the binding, may be prevented. Binding the control unit 3 to the connecting substrate 2, which is in a small size, may be performed easily.

Figure 7:
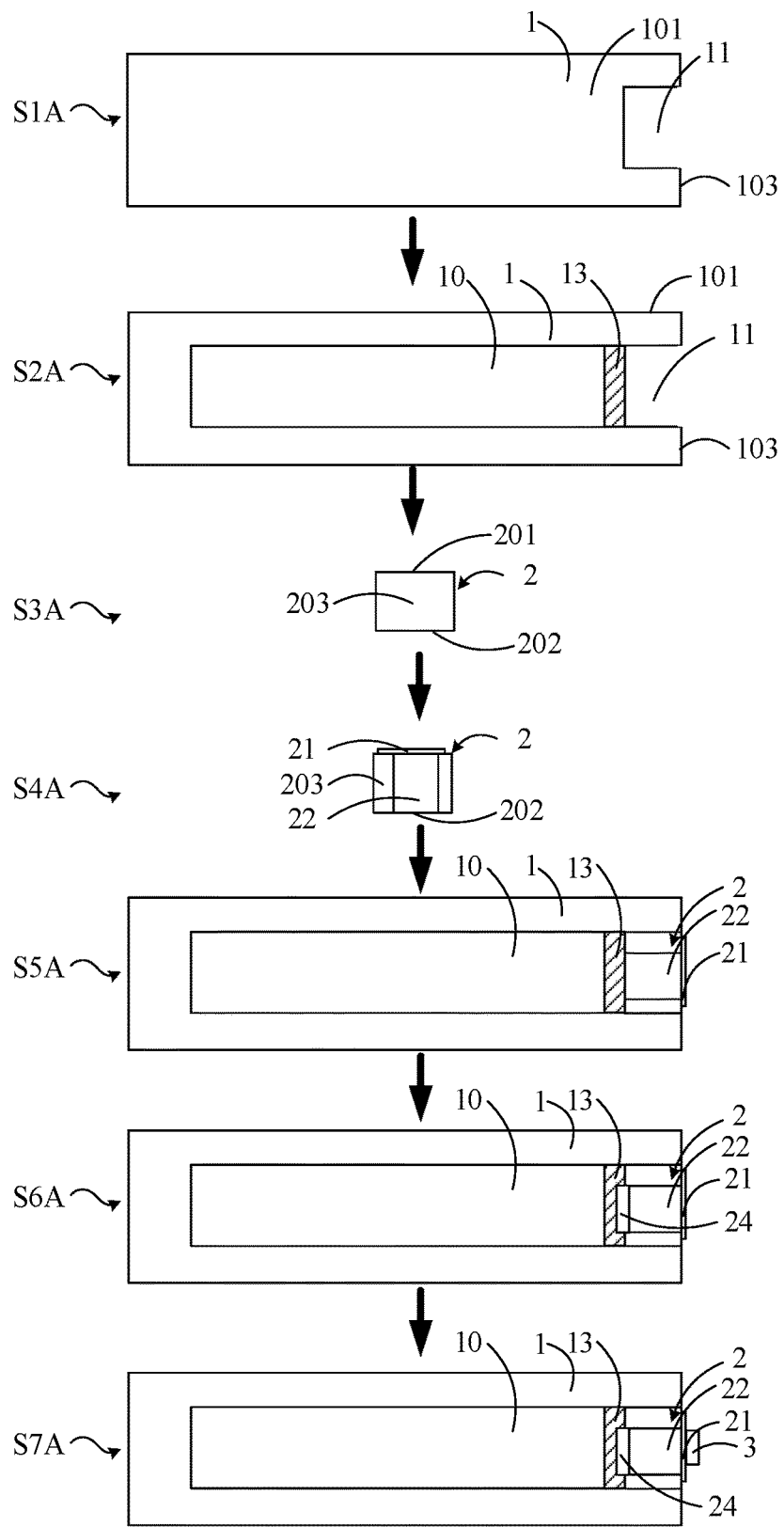
FIG. 7 is a top view of a process of manufacturing a display panel according to a third embodiment of the present disclosure.
Figure 8:
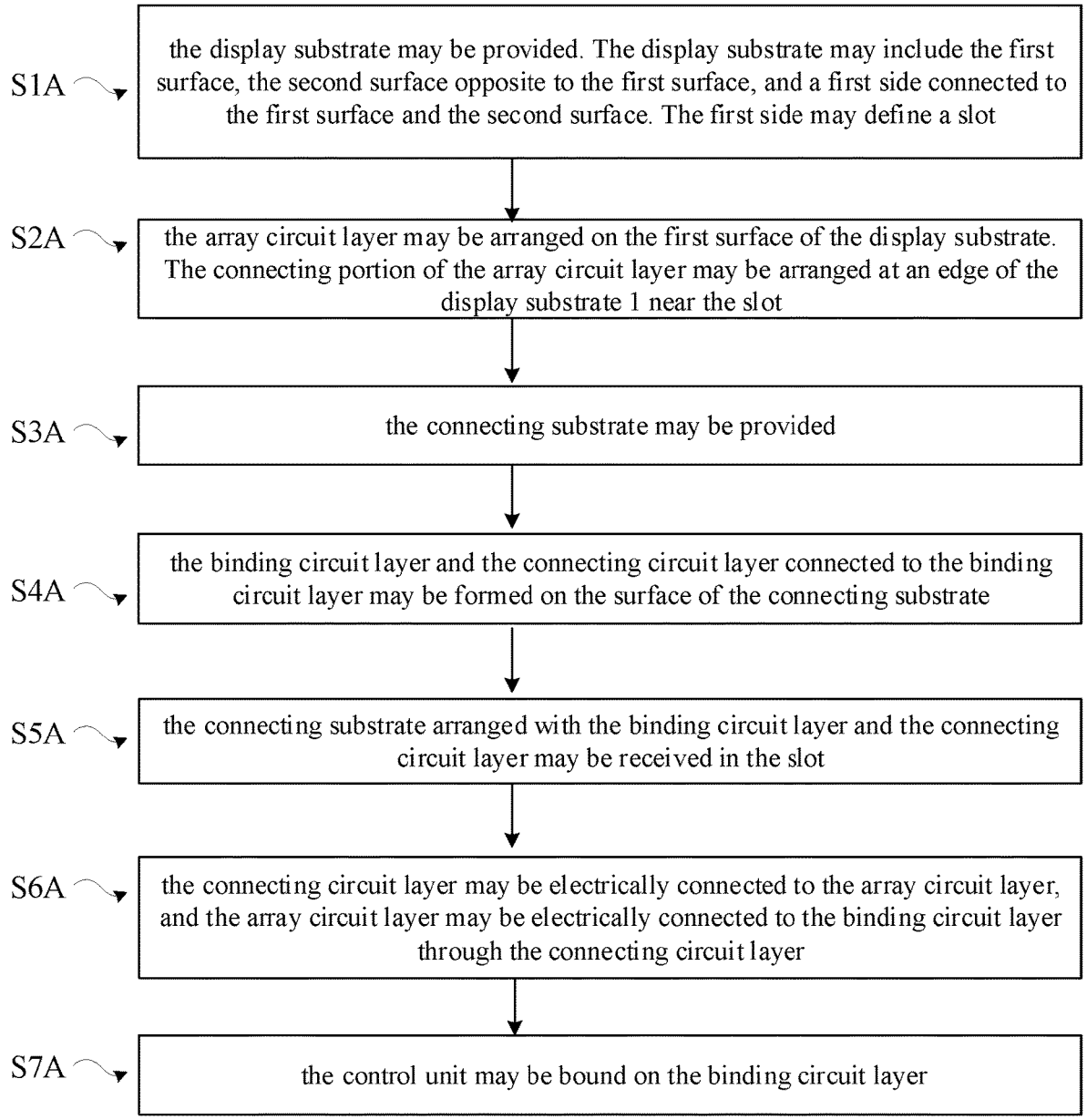
FIG. 8 is a flow chart of a method of manufacturing a display panel according to the third embodiment of the present disclosure.

As shown in FIG. 7 and FIG. 8, FIG. 7 is a top view of a process of manufacturing the display panel according to a third embodiment of the present disclosure, and FIG. 8 is a flow chart of the method of manufacturing the display panel according to the third embodiment of the present disclosure.

In the third embodiment, the method of manufacturing the display panel 100 may be substantially the same as the method in the first embodiment. Specifically, in the present embodiment, the display substrate 1 may define a slot 11. For the operation of fixing the connecting substrate 2 arranged with the binding circuit layer 21 and the connecting circuit layer 22 to the first side 103 of the display substrate 1, the connecting substrate 2 may be received in the slot 11 and snapped with a wall of the slot 11.

In detail, in the third embodiment, the method of manufacturing the display panel 100 may include following operations.

In an operation S1A, the display substrate 1 may be provided. The display substrate 1 may include the first surface 101, the second surface 102 opposite to the first surface 101, and a first side 103 connected to the first surface 101 and the second surface 102. The first side 103 may define a slot 11.

In detail, the side defining the slot 11 may alternatively be any other side surface. A shape of the slot 11 may be rectangular or trapezoidal. The shape of the slot 11 may refer to a shape defined by a wall of the slot 11 when the substrate 1 is cross-sectioned by taking along a plane perpendicular to the first surface 101 and parallel to a recessing direction of the slot 11. For example, the slot 11 may be defined as a trapezoidal groove having a large-sized bottom and a small-sized top. That is, when the substrate 1 is cross-sectioned by taking along the plane perpendicular to the first surface 101 and parallel to the recessing direction of the slot 11, a length of a bottom wall of the slot 11 may be greater than a size of an opening of the slot 11 at the surface of the side 103. In this way, connection may be achieved stably.

In an operation S2A, the array circuit layer 10 may be arranged on the first surface 101 of the display substrate 1. The connecting portion 13 of the array circuit layer 10 may be arranged at an edge of the display substrate 1 near the slot 11.

In detail, the display substrate 1 may be arranged with the array circuit layer 10 and with connecting portion 13, and the connecting portion 13 may be disposed on a side of the array circuit layer 10 near the connecting circuit layer 22. In this way, the connecting circuit layer 22 and the connecting portion 13 may be connected with each other easily. In addition, the electrical connection between the connecting circuit layer 22 and the connecting portion 13 may be achieved better.

In an operation S3A, the connecting substrate 2 may be provided.

In detail, a shape of the connecting substrate 2 may match the shape of the slot 11, and may be rectangular or trapezoidal. When the shape of the connecting substrate 2 is trapezoidal, the shape and a size of the connecting substrate 2 may match the shape and the size of the trapezoidal slot 11. That is, a side of the trapezoidal connecting substrate 2 near the bottom wall of the slot 11 may be larger, and another side of the trapezoidal connecting substrate 2 away from the bottom wall of the slot 11 may be smaller. In this way, the connecting substrate 2 may match the slot 11, and may be connected to the wall of the slot 11. Further, since the slot and the connecting substrate 2 connected to the slot are trapezoidal, connection between the connecting substrate 2 and the slot may be more stable, the connecting substrate 2 may be prevented from falling out in a horizontal direction. It shall be understood that the shape and the size of the connecting substrate 2 may be determined according to the shape and the size of the slot 11.

In an operation S4A, the binding circuit layer 21 and the connecting circuit layer 22 connected to the binding circuit layer 21 may be formed on the surface of the connecting substrate 2.

In detail, the operation S4A in the present embodiment may be the same as the operation S4 in the first embodiment and will not be repeated herein.

In an operation S5A, the connecting substrate 2 arranged with the binding circuit layer 21 and the connecting circuit layer 22 may be received in the slot 11.

In detail, the third surface 201 of the connecting substrate 2 may align with the first side 103 of the display substrate 1. The binding circuit layer 21 may be arranged on the third surface 201. Further, the third surface 201 may be arranged on the side of the connecting substrate 2 away from the display substrate 1, and the fourth surface 202 opposite to the third surface 201 may be arranged to contact the bottom wall of the slot 11 of the display substrate 1. Further, the adhesive may be arranged at the contact position between the fourth surface 202 and the bottom wall of the slot 11 to firm the connection, preventing the connecting substrate 2 from falling out in a vertical direction.

In an operation S6A, the connecting circuit layer 22 may be electrically connected to the array circuit layer 10, and the array circuit layer 10 may be electrically connected to the binding circuit layer 21 through the connecting circuit layer 22.

In detail, in the present embodiment, similarly, the connecting circuit layer 22 may be connected to the connecting portion 13 of the array circuit layer 10. Further, the anisotropic conductive adhesive 24 or the printed conductive paste may be arranged at the connection between the connecting circuit layer 22 and the connecting portion 13.

In an operation S7A, the control unit 3 may be bound on the binding circuit layer 21.

In detail, the operation S7A in the present embodiment may be the same as the operation S7 in the first embodiment, and will not be repeated herein.

In other embodiments, the shape and the size of the slot 11 is not limited, as long as the connecting substrate 2 can be received in the slot 11 and can be snapped with the wall of the slot 11.

In addition, a location where the slot 11 is defined may be a location where other functional modules are disposed on the display substrate 1, such as a location where a camera is disposed. The camera (not shown) may be arranged on a rear of the connecting substrate 2. For example, the camera may be received in another slot (not shown) of the rear of the connecting substrate 2 and may be electrically connected to the binding circuit layer 21. A second light-emitting unit (not shown) may be arranged on the surface of the connecting substrate 2. A size of the second light-emitting unit may be smaller than a size of the first light-emitting unit 4. The second light-emitting unit and the first light-emitting unit 4 may be separately controlled by different circuits of the control unit 3. The second light-emitting unit may cooperate with the first light-emitting unit 4 for displaying contents. In an embodiment, a plurality of binding circuit layers 21 and connecting circuit layers 22 may be prepared on a strip-shaped substrate, and a plurality of second light-emitting units may be transferred. Further, the strip-shaped substrate may be cut into a plurality of connecting substrates 2, and each of the plurality of connecting substrates 2 has the binding circuit layer 21, the connecting circuit layer 22, and the second light-emitting unit.

Figure 9:
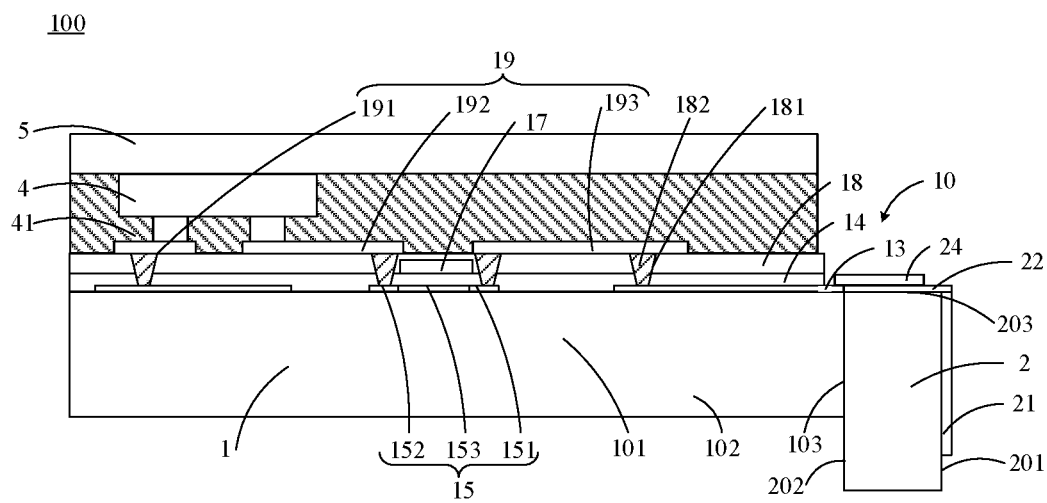
FIG. 9 is structural schematic view of the display panel according to the first embodiment of the present disclosure.

As shown in FIG. 9, FIG. 9 is structural schematic view of the display panel according to the first embodiment of the present disclosure.

The present disclosure provides the display panel 100. The display panel 100 may include the display substrate 1, the array circuit layer 10, the connecting substrate 2, and the control unit 3. The display substrate 1 may include the first surface 101, the second surface 102 opposite to the first surface 101, and a first side 103 connected to the first surface 101 and the second surface 102. The array circuit layer 10 is arranged on the first surface 101 of the display substrate 1. The connecting substrate 2 is fixed to the first side 103 of the display substrate 1. The binding circuit layer 21 and the connecting circuit layer 22 connected to the binding circuit layer 21 may be arranged on the surface of the connecting substrate 2, and the connecting circuit layer 22 may be electrically connected to the array circuit layer 10. The control unit 3 may be bound to the binding circuit layer 21.

In detail, the connecting substrate 2 may be fixed to the first side 103 of the display substrate 1 by gluing or snapping. It shall be understood that when the connecting substrate 2 is snapped to the first side 103 of the display substrate 1, the first side 103 of the display substrate 1 may define the slot 11 adapted to the size of the connecting substrate 2. The connecting substrate 2 may be received in the slot 11 and snapped to the wall of the slot 11. The connecting circuit layer 22 may be electrically connected to the array circuit layer 10 by the anisotropic conductive adhesive (not shown) or the conductive paste. The structure of the display substrate 1 may be the same as the display substrate 1 described in the above and will not be repeated herein.

In an embodiment, the connecting substrate 2 may include the third surface 201, the fourth surface 202 opposite to the third surface 201, and a second side 203 connected to the third surface 201 and the fourth surface 202. The second side 203 may align with the first surface 101 of the display substrate 1. The connecting circuit layer 22 may be arranged on the second side 203 of the connecting substrate 2. The binding circuit layer 21 may be arranged on the third surface 201 of the connecting substrate 2 and on the side of the connecting substrate 2 away from the display substrate 1.

In detail, the connecting circuit layer 22 may be electrically connected to the binding circuit layer 21, and further, the binding circuit layer 21 may be electrically connected to the array circuit layer 10 through the connecting circuit layer 22. The specific structure of the connecting substrate 2 and the connection manner between the connecting substrate 2 to the display substrate 1 may be the same as previous embodiments, and will not be repeated herein.

Further, the light-emitting unit 4 may be arranged on the array circuit layer 10. The light-emitting units 4 may be the LED, such as the micro-LED or the mini-LED. A plurality of light-emitting units 4 may be transferred to the array circuit layer 10 by performing the huge-amount-transferring method. The number of light-emitting units 4 may be one or more. The light-emitting units 4 may be fixedly connected to the array circuit layer 10 by soldering or arranging an anisotropic conductive adhesive layer (not shown).

Further, a capsulation substrate 5 may be arranged on a side of the light-emitting unit 4 away from the array circuit layer 10. In detail, an insulation material may be arranged around the light-emitting unit 4 and on a surface of the light-emitting unit 4 away from the array circuit layer 10 to form an insulating filler layer 41. The capsulation substrate 5 may be arranged to cover the insulating filler layer 41 to capsule the display panel 100. The insulating filler layer 41 may include a black matrix layer (not shown). Other functional layers may be arranged on the side of the capsulation substrate 5 away from the insulating filler layer 41, which will not be limited by the present disclosure.

According to the present disclosure, the method of manufacturing the display panel may include following operations. The display substrate is provided. The display substrate includes the first surface, the second surface opposite to the first surface, and the side surface connected to the first surface and the second surface. The array circuit layer is arranged on the first surface of the display substrate. The connecting substrate is provided. The binding circuit layer and the connecting circuit layer connected to the binding circuit layer are formed on the surface of the connecting substrate. The connecting substrate having the binding circuit layer and the connecting circuit layer is fixed to the side of the display substrate. The connecting circuit layer may be electrically connected to the array circuit layer, and the array circuit layer is electrically connected to the binding circuit layer through the connecting circuit layer. The control unit is bound on the binding circuit layer. According to the present disclosure, the connecting substrate is arranged on the side of the display substrate, and the binding circuit layer is arranged on the connecting substrate to electrically connect to the display substrate. In this way, preparing circuits on a side of the large-sized display substrate may be performed easily.

The above description shows only an implementation of the present disclosure, and does not limit the scope of the present disclosure. Any equivalent structure or equivalent process transformation performed based on the specification and the accompanying drawings of the present disclosure, directly or indirectly applied in other related technical fields, shall be equally included in the scope of the present disclosure.

What is claimed is:

1. A method of manufacturing a display panel, comprising:
    providing a display substrate, wherein the display substrate comprises a first surface, a second surface opposite to the first surface, and a first side connected to the first surface and the second surface;
    arranging an array circuit layer on the first surface of the display substrate;
    providing a connecting substrate, the connecting substrate comprises a third surface, a fourth surface opposite to the third surface, and a second side connected to the third surface and the fourth surface;
    forming a binding circuit layer and a connecting circuit layer connected to the binding circuit layer on a surface of the connecting substrate, the forming of a binding circuit layer and a connecting circuit layer connected to the binding circuit layer on a surface of the connecting substrate, comprises:
    preparing the binding circuit layer on the third surface of the connecting substrate; and
    preparing the connecting circuit layer on the second side of the connecting substrate;
    fixing a side of the connecting substrate to the first side of the display substrate, the side being opposite to the third surface arranged with the binding circuit layer;
    electrically connecting the connecting circuit layer to the array circuit layer, and electrically connecting the array circuit layer to the binding circuit layer through the connecting circuit layer; and
    binding a control unit on the binding circuit layer,
    wherein the fixing a side of the connecting substrate to the first side of the display substrate, comprises:
    aligning the second side of the connecting substrate with the first surface of the display substrate, arranging the third surface of the connecting substrate to be parallel to the first side of the display substrate, and arranging the binding circuit layer on a side of the connecting substrate away from the display substrate; and
    wherein the first side of the display substrate defines a slot, and the fixing a side of the connecting substrate to the first side of the display substrate, comprises: receiving the connecting substrate arranged with the binding circuit layer and the connecting circuit layer in the slot, and snapping the connecting substrate with a wall of the slot.

2. The method according to claim 1, wherein the fixing a side of the connecting substrate to the first side of the display substrate, comprises:
    arranging an adhesive to attach the fourth surface of the connecting substrate to the first side of the display substrate.

3. The method according to claim 1, wherein the electrically connecting the connecting circuit layer to the array circuit layer, comprises:
    arranging an anisotropic conductive adhesive or a printed conductive paste at a position where the connecting circuit layer and the array circuit layer are connected.

4. The method according to claim 1, wherein the binding a control unit on the binding circuit layer is performed before the fixing a side of the connecting substrate to the first side of the display substrate.

5. A display panel, comprising:
    a display substrate, comprising a first surface, a second surface opposite to the first surface, and a first side connected to the first surface and the second surface;
    an array circuit layer, arranged on the first surface of the display substrate;
    a connecting substrate, fixed to the first side of the display substrate, wherein the connecting substrate comprises a third surface, a fourth surface opposite to the third surface, and a second side connected to the third surface and the fourth surface;
    a binding circuit layer and a connecting circuit layer connected to the binding circuit layer, arranged on a surface of the connecting substrate, wherein a side of the connecting substrate is fixed to the first side of the display substrate, the side is opposite to the third surface arranged with the binding circuit layer, and the connecting circuit layer is electrically connected to the array circuit layer; and
    a control unit, bound on the binding circuit layer,
    wherein the first side of the display substrate defines a slot, and the connecting substrate is received in the slot and snapped with a wall of the slot.

6. The display panel according to claim 5, wherein
    the binding circuit layer is arranged on the third surface of the connecting substrate and on a side of the connecting substrate away from the display substrate.

7. The display panel according to claim 5, wherein the connecting circuit layer is electrically connected to the array circuit layer through an anisotropic conductive adhesive or a printed conductive paste.

* * * * *